United States Patent [19]

Dyck

[11] Patent Number: 4,612,522
[45] Date of Patent: Sep. 16, 1986

[54] MASK PROGRAMMABLE CHARGE COUPLED DEVICE TRANSVERSAL FILTER

[75] Inventor: Rudolph H. Dyck, Palo Alto, Calif.

[73] Assignee: Fairchild Camera & Instrument Corporation, Mountain View, Calif.

[21] Appl. No.: 376,894

[22] Filed: May 10, 1982

[51] Int. Cl.[4] .................. H03H 15/02; H03K 5/159; G11C 19/28
[52] U.S. Cl. .................................. 333/165; 333/166; 357/24; 377/60
[58] Field of Search ................. 333/165–167; 357/24 R, 24 M, 45; 377/57, 60, 63, 76, 77; 364/824, 825, 862

[56] References Cited

U.S. PATENT DOCUMENTS

| | | | |
|---|---|---|---|
| 3,633,268 | 1/1972 | Engbert | 357/45 X |
| 3,699,403 | 10/1972 | Boleky, III | 357/45 |
| 3,947,934 | 4/1976 | Olson | 333/175 |
| 4,156,284 | 5/1979 | Engeler | 357/24 X |
| 4,161,785 | 7/1979 | Gasparek | 357/24 X |
| 4,232,279 | 11/1980 | Prince | 357/24 X |
| 4,291,286 | 9/1981 | Wagner | 333/202 X |

OTHER PUBLICATIONS

Wallinga et al.–"An Electrically Programmable CCD Transversal Filter with Variable Capacitance Weight Factors", IEEE Journal of Solid-State Circuits, vol. Sc-14, No. 3, Jun. 1979; pp. 538-542.

Seevinck–"An Uncommitted Integrated Circuit", The Transactions of the SA Institute of Electrical Engineers, Aug. 1976; pp. 222-225.

Primary Examiner—Marvin L. Nussbaum
Attorney, Agent, or Firm—Carl L. Silverman; Stephen J. Phillips; Robert C. Colwell

[57] ABSTRACT

A programmable charge coupled device transversal filter 5 includes a charge coupled device register 10 for receiving and delaying incoming analog signals, a series of floating gate charge detectors 15, a corresponding number of sets of binary scaled capacitors $C_0, \ldots 2C_0 \ldots 2^n C_0$, an output circuit including a positive and negative bus coupled to a differential amplifier, and mask or otherwise definable electrical connections for connecting selected ones of the scaled sets of capacitors between the floating gate 15 corresponding to that set and one of the positive and negative buses 22 and 23.

6 Claims, 6 Drawing Figures

MASK PROGRAMMABLE CHARGE COUPLED DEVICE TRANSVERSAL FILTER

BACKGROUND OF THE INVENTION

1. Field of the Invention

This invention relates to charge transfer devices, and in particular to transversal filters manufactured from charge coupled devices in which the tap weights are achieved with a network of mask programmable capacitors.

2. Description of the Prior Art

The use of charge transfer devices in transversal filters is known. See, e.g. "Transversal Filtering Using Charge-Transfer Devices, by Buss et al., *IEEE Journal of Solid-State Circuits*, Vol. SC-8, No. 2, April 1973, pgs. 138–146. As described by that article, a transversal filter usually consists of a sampling stage followed by a series of delay stages, each of which delays the signal by a number of clock periods. As the signal passes each delay stage it is non-destructively sampled and an appropriate weighting coefficient is applied. The weighted signals from the delaying stages are then summed together to give the filter output. The theory and operation of such devices is further discussed in that article.

In a number of laboratories throughout the world efforts have been made to achieve practical charge coupled device (CCD) transversal filters for a variety of signal processing applications. Very high performance fixed-tap-weight filters have been developed which illustrate the utility of such filters. For example, a monolithic D3 filter for a telephone CODEC was reported in "A PCM Voice CODEC with On-Chip Filters," by J. Terry et al., *Digest of the* 1978 *International Solid-State Circuits Conference*, pg. 182.

A number of programmable analog tap-weight filters have also been developed. Unfortunately these have all required a large number of near real-time inputs which necessitate many connections to the integrated circuit, a large memory, or both. Although these complex systems may be practical for certain multifunction systems where the charge coupled device may be re-programmed from one filter function to another, they are rarely practical where a fixed, single-function is required.

Many system designers have sought small integrated circuit filters to provide specific spectral characteristics, yet need them only in moderate quantities on the order of less than a thousand pieces, at prices of less than one hundred dollars each. Such potential users can rarely justify the cost or development time of a custom integrated circuit chip program.

One prior art attempt to meet this demand is described in "An Electrically Programmable CCD Transversal Filter with Variable Capacitance Weight Factors," by H. Wallinga and I. Hylkema, *IEEE Journal of Solid-State Circuits*, Vol. SC-14, No. 3, June 1979, at pgs. 538–542. The approach described in that article involves electrically programming the tap-weights through voltage-dependent capacitors. To bias these voltage-dependent capacitors to a desired value, that technique relies upon an additional capacitor to de-couple the reset bias of the floating gate sense amplifier and the tap-weight reference voltage.

SUMMARY OF THE INVENTION

This invention provides a programmable CCD transveral filter which has a desired specific spectral characteristic determined by only a relatively small number of masking steps in the fabrication of such a device, preferably in the final mask. The invention also provides a filter having a wide frequency range of operation at a very low development cost and at a relatively low piece cost to the ultimate consumer.

In the preferred embodiment of this invention a transveral filter includes a charge coupled device register containing a first element for receiving an incoming electrical signal, a first plurality of elements for delaying the signal, a second plurality of scaled sets of capacitors, an output circuit, and means for coupling selected ones of each of the scaled sets of capacitors between selected ones of the first plurality of elements and the output circuit. Typically the invention includes a one and one-half phase charge coupled device register with a number of equal weight taps, a binary-scaled set of capacitors for each tap, a custom metal layout determined by the spectral characteristic desired by the purchaser of the device, which metal layout connects the capacitors to a divider network to couple a fraction of each tap signal onto either of two output buses, and an output circuit such as a low gain differential amplifier.

In a preferred embodiment the programmable filter of this invention is manufactured using a 64 stage buried N-channel CCD register, resettable floating gates, and polycrystalline silicon MOS N-channel capacitors.

DETAILED DESCRIPTION OF THE PREFERRED EMBODIMENT

Figure 1:
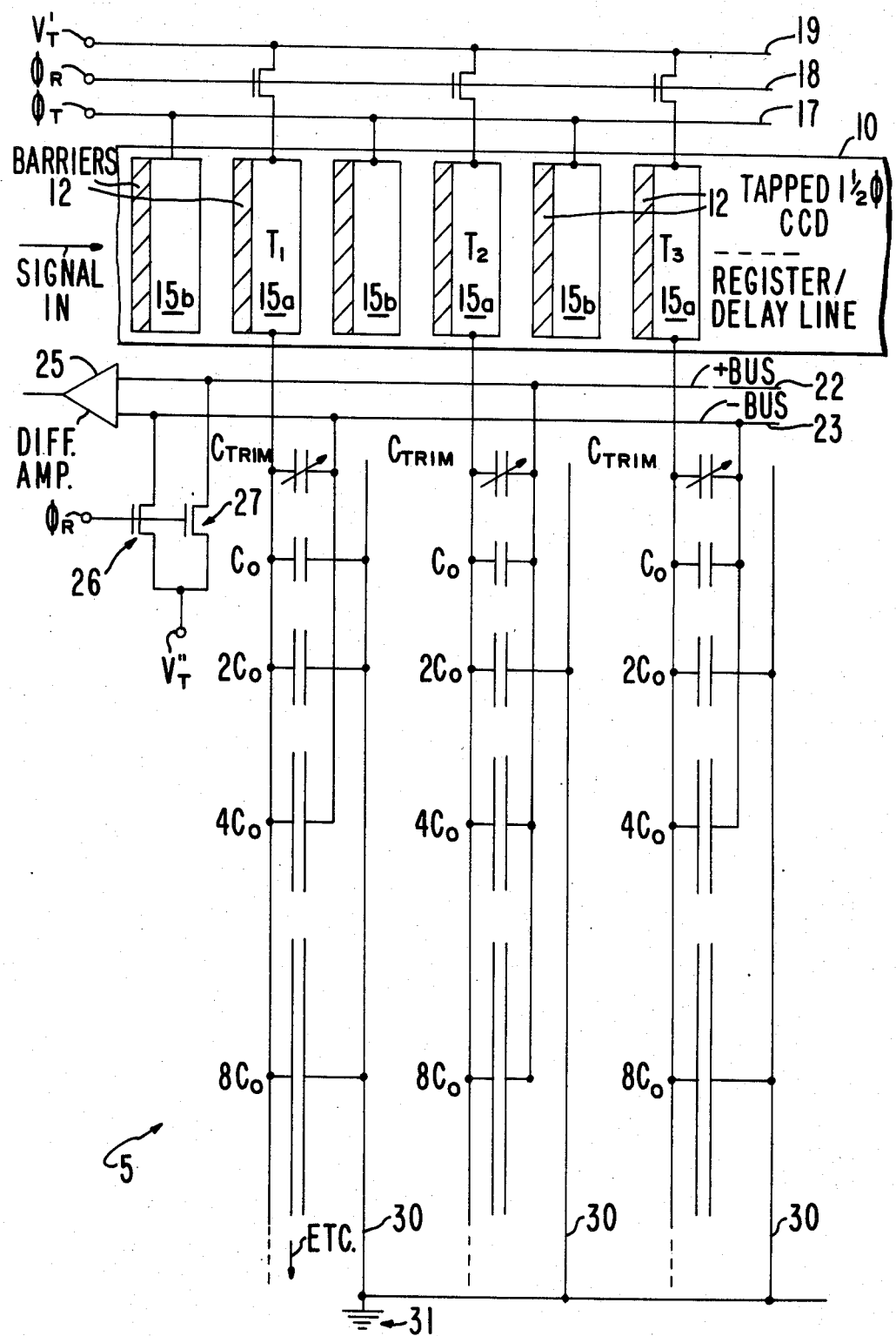
FIG. 1 is a schematic view of one embodiment of the mask-programmable CCD transveral filter of this invention.

FIG. 1 illustrates schmatically one embodiment of the mask programmable CCD transversal filter of this invention. As shown the filter 5 includes a charge coupled device register 10 containing implanted barrier regions 12. The register may be designed to use any well-known charge coupled device clocking system, however, in the preferred embodiment register 10 is a one and one-half phase CCD register, which includes overlying floating gate charge detectors 15a and charge transfer clock gates 15b, typically fabricated from doped poly-crystalline silicon. In a well-known fashion an analog signal is supplied to the CCD register 10 on the left side of FIG. 1. The analog signal in the form of a charge packet is then clocked along the register 10 using a transfer signal, a reset signal, and a bias level supplied to the electrodes 15a and 15b from buses 17, 18, and 19. The transfer gate signal $\phi_T$ is supplied directly to electrodes 15b, while a reset signal $\phi_R$ on bus 18 permits resetting the floating gates 15a to a potential $V'_T$ on bus 19. The operation of one and one-half phase charge coupled devices is widely described in the literature.

The electrodes 15b function as equal weight taps $T_1$, $T_2$ and $T_3$, etc. In the preferred embodiment each tap $T_1$, $T_2$, etc. has associated therewith a binary-scaled set of capacitors, $C_0$, $2C_0$, $4C_0$, ... $32C_0$, only the first four of which are shown in FIG. 1. In addition each tap has associated with it a trimming capacitor $C_{TRIM}$ as shown. In this manner a capacitance of up to $63C_0 + C_{TRIM}$ is achievable on any tap.

Disposed near the charge coupled device register 10 are also a positive bus 22 and a negative bus 23. The positive and negative buses are connected to a suitable output circuit, which in FIG. 1 includes a differential amplifier 25 and a pair of reset transistors 26 and 27 controlled by a reset signal $\phi_R$ for resetting the positive bus 22 and negative bus 23 to a desired potential $V_T''$.

As shown by FIG. 1, one plate of each capacitor in the binary scaled set of capacitors is coupled to the corresponding tap. The other plate of each capacitor is coupled either to ground 31 via connection 30, or to one of the positive bus 22 or the negative bus 23 thus forming a capacitive divider circuit for each tap. For example, for the bank of capacitors associated with tap $T_1$ only capacitors $C_{TRIM}$ and $4C_0$ are coupled to negative bus 23. All of the remaining capacitors are coupled to ground 31 via connection 30. None of the capacitors associated with tap $T_1$ are coupled to the positive bus 22. For the example depicted in FIG. 1 in conjunction with tap $T_2$, capacitors $C_{TRIM}$, $C_0$, $4C_0$, and $8C_0$ are coupled to the positive bus 22, while the remaining capacitors in that scaled set are coupled to ground 31 which may be any AC ground. The capacitors associated with tap $T_3$ are connected as shown.

The effect of the hypothetical connections shown in FIG. 1 is to provide a negative tap weight of 4 units plus a fraction from the trimming capacitor for the first tap, a positive tap weight of 13 units plus the trim weight for the second tap, and a negative tap weight of 5 units plus the trimming capacitor for the third tap. As many taps and scaled sets of capacitors as desired may be employed. In the preferred embodiment the CCD register includes 64 stages or taps, and fixed capacitances up to $32C_0$ are used. This results in a total capacitance per tap of about $64C_0$, and a maximum tap weight of approximately 64 units. The trimming capacitors $C_{TRIM}$ simply provide a means for making fine adjustments of less than one unit of capacitance in the tap weight.

The time delay necessary for the transversal filter is created by the stages of the CCD register 10. The circuit associated with each tap provides a means for sampling and weighting the signal detected by that tap, while the positive and negative buses 22 and 23, in conjunction with differential amplifier 25 provide a means for summing the outputs of the various taps.

A primary feature of this invention is that the capacitance weighting associated with each tap is determined by a masking step near the end of the process used to fabricate the transversal filter. In the preferred embodiment the metal mask determines which capacitors are connected respectively to ground 31 and to either the positive bus 22, or the negative bus 23. In this manner, the filter 5 may be designed to suit the desired spectral characteristics sought by a customer by customizing one mask in the fabrication procedure. This enables the manufacturer of such filters to maintain an inventory of partially completed devices which, with only minimal subsequent processing in conjunction with the customized mask, result in the desired transversal filter. This feature allows relatively rapid response to customer specifications.

Figure 2:
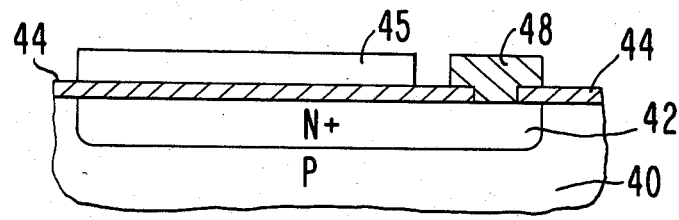
FIG. 2 is a cross-sectional view illustrating one technique for fabricating the capacitor shown in FIG. 1.

FIG. 2 is a cross-sectional view illustrating one technique for fabricating each capacitor shown in FIG. 1. The structure shown in FIG. 2 includes a P conductivity type substrate 40 which is also the substrate of the CCD register 10, a strongly doped N conductivity region 42 in the substrate, an overlying layer of insulating material 44, typically silicon dioxide, a region 45 of doped polycrystalline silicon, and a metal electrode 48. One plate of the capacitor is formed by polycrystalline silicon 45 while the other plate is formed by the implanted or diffused region 42. Connections to the capacitor are formed by a connections to polycrystalline silicon 45 and to metal electrode 48 (which is connected to doped region 42). In this case, the insulating material 44 separating the "plates" of the capacitor is the gate dielectric which generally can provide the highest capacitance per unit area. Different capacitances are created by increasing or decreasing the sizes of the plates. The capacitor shown in FIG. 2 may be fabricated utilizing well-known semiconductor manufacturing processes.

Figure 3:
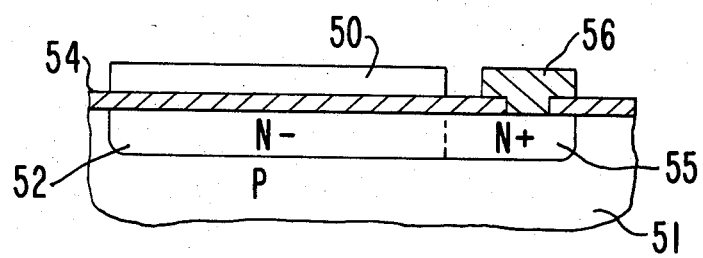
FIG. 3 is a cross-sectional view illustrating another technique for fabricating the capacitor shown in FIG. 1.

Another embodiment of the capacitors is shown in FIG. 3. This capacitor is formed by a doped polycrystalline silicon region 50 being separated from a lightly doped N conductivity region 52 by insulating material 54. A more heavily doped portion 55 of substrate 51 serves to electrically connect the metal electrode 56 to the N type region 52. Because the buried channel well regions of register 10 are lightly doped with N conductivity type impurity the embodiment depicted in FIG. 3 may be simultaneously fabricated using the same process steps used to fabricate the charge coupled device register 10. Accordingly, the lower plate 52 of the capacitor shown in FIG. 3 may be created by the same diffusion or implantation step used to fabricate barriers 12. The N+ region 55 may be created at the same time polycrystalline silicon 50 is doped to make it electrically conductive.

Figure 4:
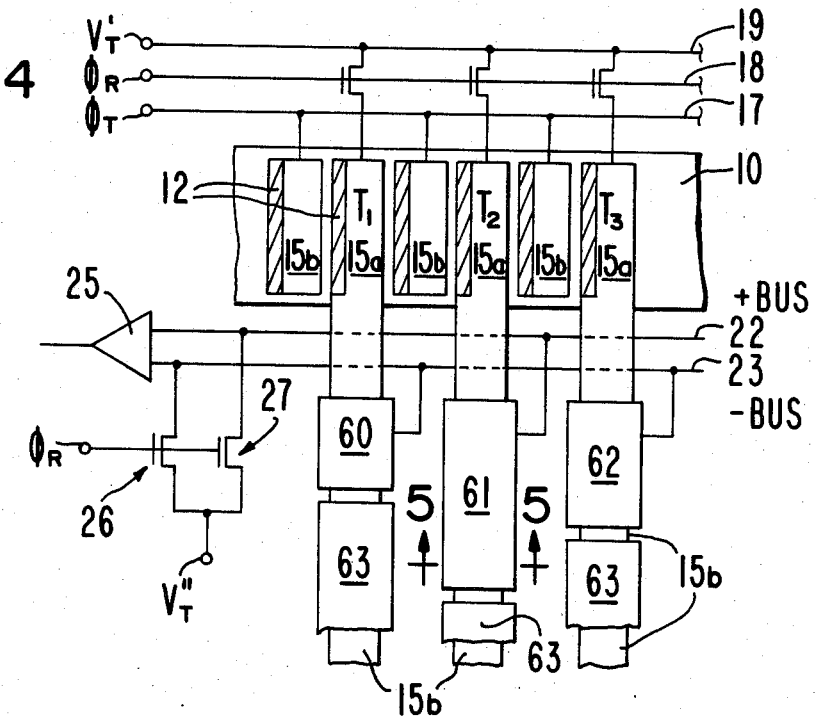
FIG. 4 is a schematic drawing of another embodiment of the mask programmable filter of this invention.

FIG. 4 is a schematic view of another embodiment of the mask programmable transversal filter of this invention. Elements in FIG. 4 corresponding to those in FIG. 1 have been given the same reference numerals. For example, the CCD register is designated as 10, the clock signal buses 17, 18, and 19, the positive and negative bus 22 and 23, and differential amplifier 25. A similar reset circuit comprised of transistors 26 and 27 is used to reset the buses 22 and 23. For the embodiment depicted in FIG. 4, however, the capacitors are formed by extending the polysilicon floating gate taps $T_1$, $T_2$ . . . away from the CCD channel 10, and subsequently depositing a layer of metal above the polycrystalline silicon as described in conjunction with FIG. 5. FIG. 4 illustrates how a first smaller region 60 of metal is connected to bus 23, while a second larger region 61 is coupled to bus 22, and a third intermediate sized region 62 is coupled to bus 23. By appropriate sizing of the regions of metal 60, 61 . . . , appropriate weighted capacitances may be created between the extended tap 15 and the overlying metal 60, 61 . . . .

Figure 5:
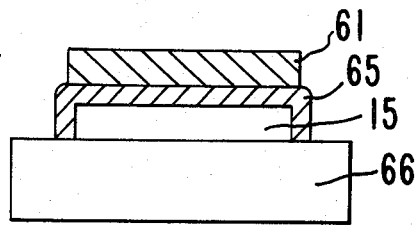
FIG. 5 is a cross-section of a portion of the structure of FIG. 4.

The structure of the capacitors used in FIG. 4 is more clearly shown by FIG. 5. FIG. 5 illustrates the relationship of the substrate 66, overlying doped polycrystalline silicon 15, intervening insulating material 65 and metal 61. Metal 61 forms one plate of the capacitor, which is connected to the appropriate bus 22 or 23, while polycrystalline silicon 15 forms the other plate of the capacitor. The two plates are typically separated by a thin layer of silicon dioxide 65. As explained in conjunction with the binary scaled sets of capacitors described in FIG. 1, the size of metal regions 60, 61 ... may be made appropriate to create the desired spectral characteristics for the transversal filter. The capacitor from each tap to ground is similarly achieved, with the ground electrode being another metal region 63. Of course, in the same manner as described with respect to FIG. 1, as many stages and as much capacitance as desired may be fabricated by extending the CCD register to the right and by lengthening the regions of metal.

Figure 6:
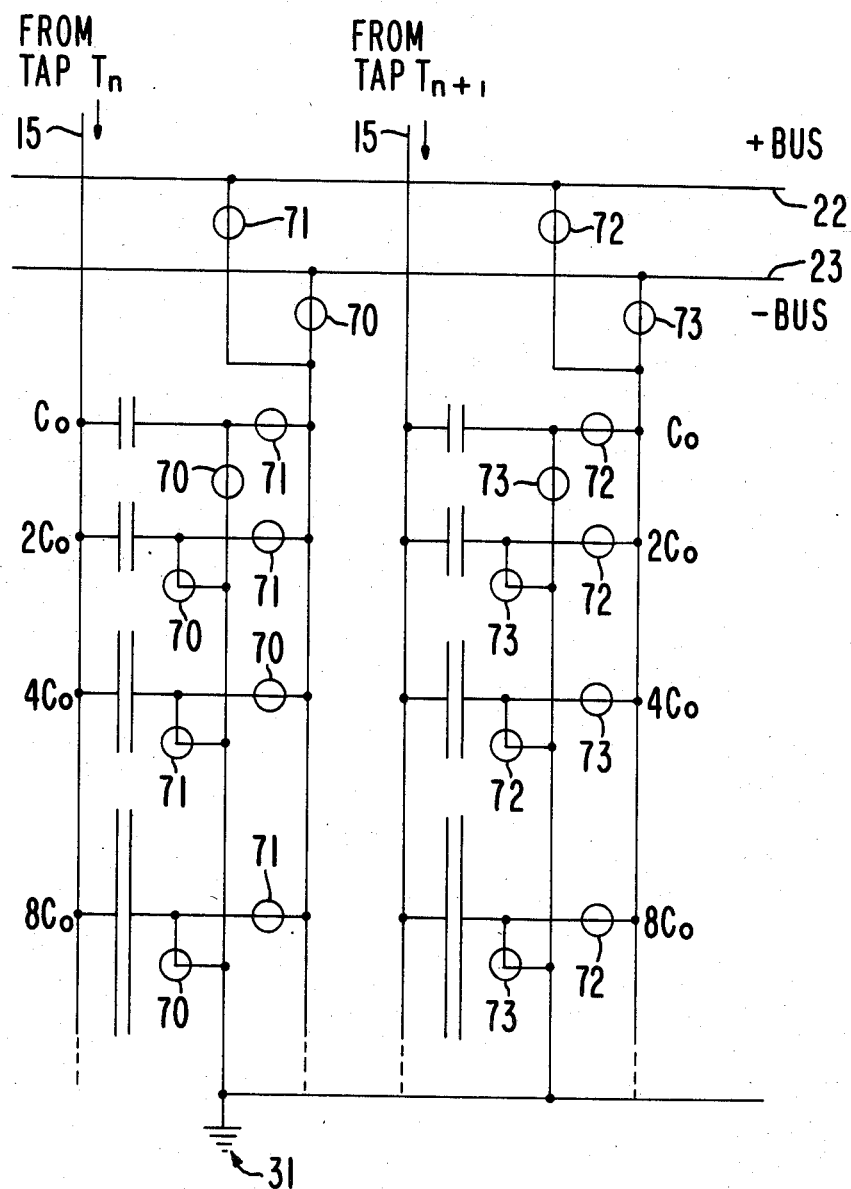
FIG. 6 is a schematic drawing of still another embodiment of the invention.

FIG. 6 is a circuit schematic illustrating yet another embodiment of the invention in which binarily scaled sets of capacitors are fabricated, together with all necessary metal connections. FIG. 6 is a schematic diagram of this embodiment of the invention in which all necessary metal lines for connecting the binary scaled sets of capacitances to each of the positive bus 22, negative bus 23, or ground 31 are provided. A new mask is then used to remove portions of the metal lines to create the appropriate connections. For example, if in the binary set of capacitors associated with line 15 from tap $T_n$, capacitances $C_0$, $2C_0$ and $8C_0$ are to be connected to the positive bus, then those portions of the metal lines designated 70 are removed, and those portions of the metal lines designated 71 are left intact. In this manner capacitor $4C_0$ is connected to ground 31, while the other three capacitors are connected to positive bus 22.

Other techniques also may be used for connecting the selected capacitors to the appropriate buses 22 and 23 or to ground. For example, in FIG. 6 each of the locations designated 70, 71, 72 or 73 may be fabricated as fuses, appropriate ones of which are "blown" so as to leave the several capacitances connected respectively to the appropriate buses or to ground. Polycrystalline silicon fuses which are normally closed, and later blown using a laser are well-known. See, e.g., "Cost-Effective Yield Improvement in Fault-Tolerant VLSI Memory," by J. F. M. Bindels, 1981 Digest of Technical Papers of International Solid State Circuits Conference, pages 82 and 83. Also known are normally open fuses fabricated from an intervening region of undoped silicon between two doped regions, where the intervening region may be doped using the diffusion resulting from heating by a laser. Another technique is to use highly automated metal mask layout in which the initial mask design only necessitates the computer to make breaks in the lines at desired locations, for example, some of locations 70, 71, 72 and 73 shown in FIG. 6.

The embodiments of the invention described above enable the efficient fabrication of transversal filters having customized spectral characteristics. The invention eliminates the necessity of a substantially complete custom integrated circuit development program as has usually been necessary to provide a customized filter. As many stages as necessary, up to a maximum number, may be provided for the desired filter.

The frequency range of operation of the structure shown exceeds that of older split-electrode type filters, and provides a filter having a wide dynamic range. The absence of any split-electrode CCD structure in the filter embodiments described here circumvents a major limitation that exists with split-electrode filters, namely, degradation of performance at high signal frequencies due to inaccurate charge packet partitioning. This limitation in split-electrode filters can become a problem for frequencies near 1 MHz and above. The filter embodiments described here can perform without significant degradation at frequencies of approximately 10 to 20 MHz and higher.

Although several embodiments of the transversal filter of this invention have been described above, these embodiments serve primarily to illustrate the invention, rather than limit it. The full scope of the invention may be ascertained from the appended claims.

I claim:

1. A filter comprising:
   a charge coupled device delay line comprised of individual charge storage elements for receiving an incoming electrical signal, the delay line containing a plurality of charge-sensing elements for sensing charge in the individual charge storage elements of said delay line;
   a plurality of capacitors coupled to each said charge sensing element;
   an output circuit;
   a bus for connecting selected capacitors associated with each said charge-sensing element to said output circuit; and
   wherein the plurality of capacitors have values of capacitance which comprise binary scaled sets.

2. A filter comprising:
   a charge coupled device delay line comprised of individual charge storage elements for receiving an incoming electrical signal, the delay line containing a plurality of charge-sensing elements for sensing charge in the individual charge storage elements of said delay line;
   a plurality of capacitors coupled to each said charge sensing element; .
   an output circuit;
   a bus for connecting selected capacitors associated with each said charge-sensing element to said output circuit; and
   wherein the output circuit comprises first and second summing buses for coupling selected capacitors to a differential output amplifier.

3. A filter as in claim 2 wherein the plurality of charge sensing elements comprises a first plurality of floating gates.

4. A filter comprising:
   a charge coupled device delay line comprised of individual charge storage elements for receiving an incoming electrical signal, the delay line containing a plurality of charge-sensing elements for sensing charge in the individual charge storage elements of said delay line;
   a plurality of capacitors coupled to each said charge sensing element;
   an output circuit;
   a bus for connecting selected capacitors associated with each said charge-sensing element to said output circuit; and
   wherein the bus includes selectively alterable fuses.

5. A mask programmable charge coupled device transversal filter comprising:
   a charge cupled device delay line for receiving an incoming analog signal, the delay line including a first plurality of charge sensing elements, each having a corresponding floating gate;
   a plurality of sets of capacitors, each set having a common terminal connected to one of said floating gates and each set containing capacitors scaled from one unit to $2^n$ units of capacitance where n is an integer;

an output circuit containing positive and negative buses coupled to a differential amplifier; and a plurality of buses, each bus connecting selected ones of each set of capacitors between a floating gate coupled to that set, and one of the positive and negative buses.

6. A filter as in claim 5 is fabricated on a semiconductor substrate and wherein the buses are conductive lines on the semiconductor substrate.

* * * * *